(12) United States Patent
Lu et al.

(10) Patent No.: US 9,097,878 B2
(45) Date of Patent: Aug. 4, 2015

(54) IMAGE CAPTURE MODULE

(71) Applicant: HIMAX TECHNOLOGIES LIMITED, Tainan (TW)

(72) Inventors: Yin-Dong Lu, Tainan (TW); Han-Yi Kuo, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 239 days.

(21) Appl. No.: 13/886,782

(22) Filed: May 3, 2013

(65) Prior Publication Data

US 2014/0326855 A1   Nov. 6, 2014

(51) Int. Cl.
*H01L 27/146* (2006.01)
*G02B 13/00* (2006.01)
*G02B 5/00* (2006.01)
*H04N 5/225* (2006.01)

(52) U.S. Cl.
CPC ............ *G02B 13/0085* (2013.01); *G02B 5/005* (2013.01); *H01L 27/14618* (2013.01); *H01L 27/14625* (2013.01); *H04N 5/2257* (2013.01); *H04N 5/2258* (2013.01); *H01L 2924/0002* (2013.01)

(58) Field of Classification Search
CPC .. G02B 13/0085; G02B 5/005; H04N 5/2257; H04N 5/2258; H01L 27/14618; H01L 27/14625; H01L 2924/0002
USPC .................... 369/44.11–44.42; 359/811–830; 250/208.1
See application file for complete search history.

(56) References Cited

U.S. PATENT DOCUMENTS

| | | | | |
|---|---|---|---|---|
| 7,956,924 B2 * | 6/2011 | Georgiev | ....................... | 348/340 |
| 2008/0273255 A1 * | 11/2008 | Yang et al. | .................... | 359/819 |
| 2008/0278621 A1 * | 11/2008 | Cho et al. | ...................... | 348/374 |

* cited by examiner

*Primary Examiner* — Renee D Chavez
(74) *Attorney, Agent, or Firm* — McClure, Qualey & Rodack, LLP

(57) ABSTRACT

An image capture module is disclosed, which includes a holder and a lens unit. A plurality of through holes are disposed on the holder, wherein at least one light blocking portion is disposed between the two adjacent through holes. The lens unit is disposed in the holder and has a plurality of light gathering regions and at least one non-light gathering region, wherein the light gathering regions respectively align with each of the through holes, and the non-light gathering region aligns with the light blocking portion.

5 Claims, 10 Drawing Sheets

IMAGE CAPTURE MODULE

BACKGROUND OF THE INVENTION

1. Field of the Invention

The invention relates to an optical element, and in particular, relates to an image capture module in which a lens unit has two or more than two light gathering regions to capture images.

2. Description of the Related Art

Miniaturized cameras are widely used in many electronic products, such as mobile phones. Recently, wafer level camera modules (WLCM) that include a wafer-level lens module therein have been implemented in miniaturized cameras. The wafer level lens module is manufactured by arranging and stacking a plurality of transparent wafers, wherein each transparent wafers has polymer lenses formed in an array using a replica method, before being cut. For example, referring to FIG. 1, the conventional miniaturized camera module 100 has an image sensor device 110, a spacer 120 and a lens device 130. The spacer 120 has a through hole 122 such that light emitted to the lens device 130 may be emitted to the image sensor device 110 through the through hole 122.

In order to meet high imaging quality requirements, the image sensor device 110 should have a resolution of over 1000 pixels or higher. However, this leads to an increase in the cost of the camera module 100. In addition, during processes or transportation, when the image capture module 100 sustains an impact, the image sensor device 110 and the spacer 120 (or the spacer 120 and the lens unit device 130) are easily displaced or even separated such that the imaging quality of the image capture module 100 is lowered or the image capture module 100 is damaged.

Moreover, since the conventional spacer 120 is usually made of transparent material, such as glass or plastic, light may inevitably enter the image capture module 100 via the spacer 120 and be project into the image sensor device 110 which may cause noise and affect the imaging quality of the image capture module 100.

BRIEF SUMMARY OF THE INVENTION

In this regard, one objective of the disclosure is to provide an image capture module with high imaging quality. The other objective of the invention is to provide an image capture module having high structural strength.

According to one embodiment, the image capture module of the disclosure includes a holder and a lens unit. The holder includes a first member and a second member. A plurality of through holes are disposed on the first member in a matrix, and the first member includes at least one light blocking portion disposed between the two adjacent through holes. The second member is connected to the first member, wherein at least one first chamber is defined by the second member. The lens unit is disposed in the at least one first chamber of the holder, wherein the lens unit has a front surface and a rear surface opposite to the front surface, and the front surface includes a plurality of light gathering regions respectively aligning with each of the plurality of through holes, and at least one non-light gathering region is disposed between two adjacent light gathering regions and aligns with the light blocking portion.

In the above-mentioned embodiment, the at least one non-light gathering region extending between two adjacent light gathering regions, and the first member covers the non-light gathering region of the lens unit. Additionally, a surface of the light blocking portion that aligns with the non-light gathering region of the lens unit is a flat surface.

In the above-mentioned embodiment, the second member integrally extends from a peripheral edge of the first member to define the first chamber.

Alternatively, the first member is detachably connected to the second member. In this case, the first member includes a top wall and a peripheral wall peripherally extending from the top wall to hold the lens unit, wherein the plurality of through holes are disposed on the top wall, and the peripheral wall of the first member includes an outer screw thread, and the second member includes an inner screw thread in the first chamber. The first member is connected to the second member via an engagement of the inner screw thread and the outer screw thread.

In the above-mentioned embodiment, the image capture module includes a plurality of lens units, wherein a plurality of first chambers are defined by the second member, and the holder includes a plurality of first members respectively disposed in each of the plurality of first chambers and holds the lens units.

In the above-mentioned embodiment, the image capture module includes an image sensor unit, wherein at least one second chamber that communicates with the first chamber is defined by the second member, and the image sensor unit aligns with the rear surface of the lens unit and is disposed in the second chamber.

In the other embodiment, the image capture module includes a holder and a plurality of lens units. The holder includes a plurality of first members, wherein at least one through hole is disposed on each of the plurality of first members. The second member is detachably connected to the plurality of first members, wherein a plurality of first chambers are defined by the second member, and the plurality of first members are respectively disposed in the plurality of first chambers. The plurality of lens units are respectively held by one of the first members, wherein each of the plurality of lens units has a front surface and a rear surface opposite to the front surface, and the front surface includes a light gathering region aligning with the through hole of the corresponding first member.

In the above-mentioned embodiment, each of the plurality of first members includes a top wall and a peripheral wall peripherally protruding from the top wall to hold one of the plurality of the lens units, wherein the through hole is disposed on the top wall, and the peripheral wall of the first member includes an outer screw thread, and the second member includes an inner screw thread in the first chamber. Each of the first members is connected to the second member via an engagement of the inner screw thread and the outer screw thread.

In the above-mentioned embodiment, the image capture module includes a plurality of image sensor units, wherein a plurality of second chambers that communicate with the corresponding first chambers are defined by the second member, and each of the plurality of image sensor units aligns with the rear surface of the corresponding lens unit and is disposed in the each of the second chambers.

In summary, the holder of the disclosure effectively fixes all of the device (such as the image sensor unit, the lens unit) such that the structural strength of the image capture module is enhanced and the imaging quality of the image capture module is ensured.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
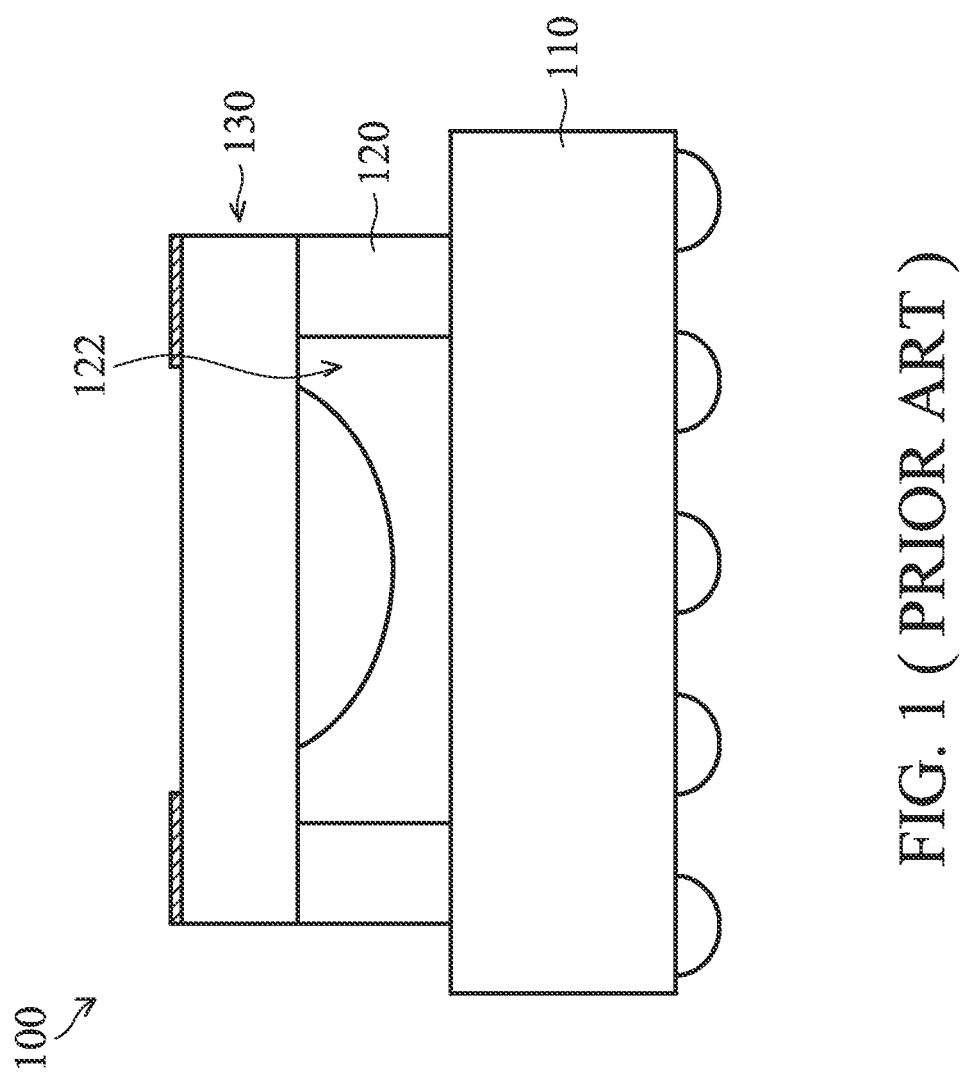
FIG. 1 shows a cross-sectional view of a conventional image capture module.
Figure 2:
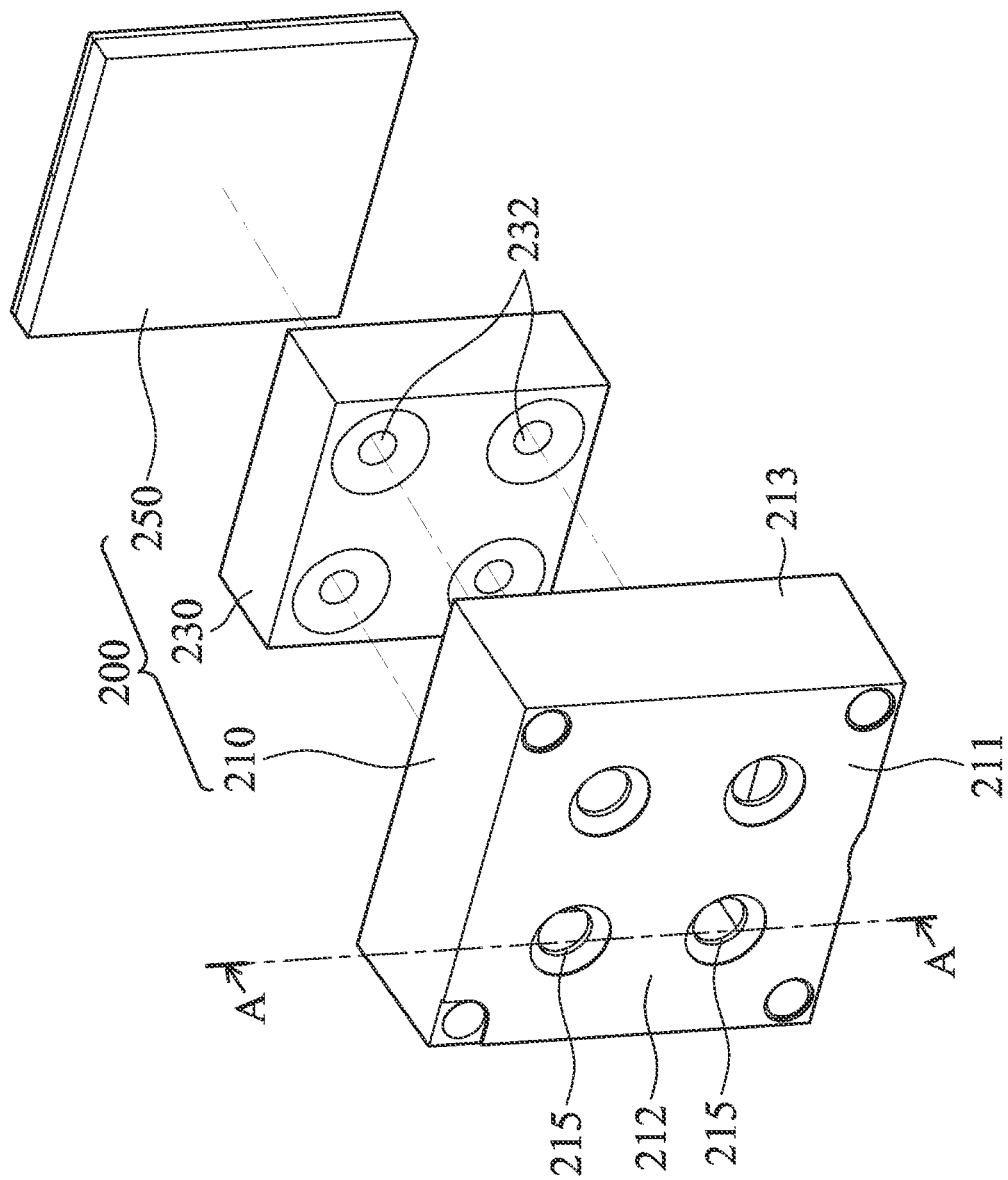
FIG. 2 shows an explosive view of the image capture module in accordance with the first embodiment of the disclosure.

Referring to FIG. 2, according to a first embodiment of the disclosure, an image capture module 200 includes a holder 210, a lens unit 230 and an image sensor unit 250.

Figure 3:
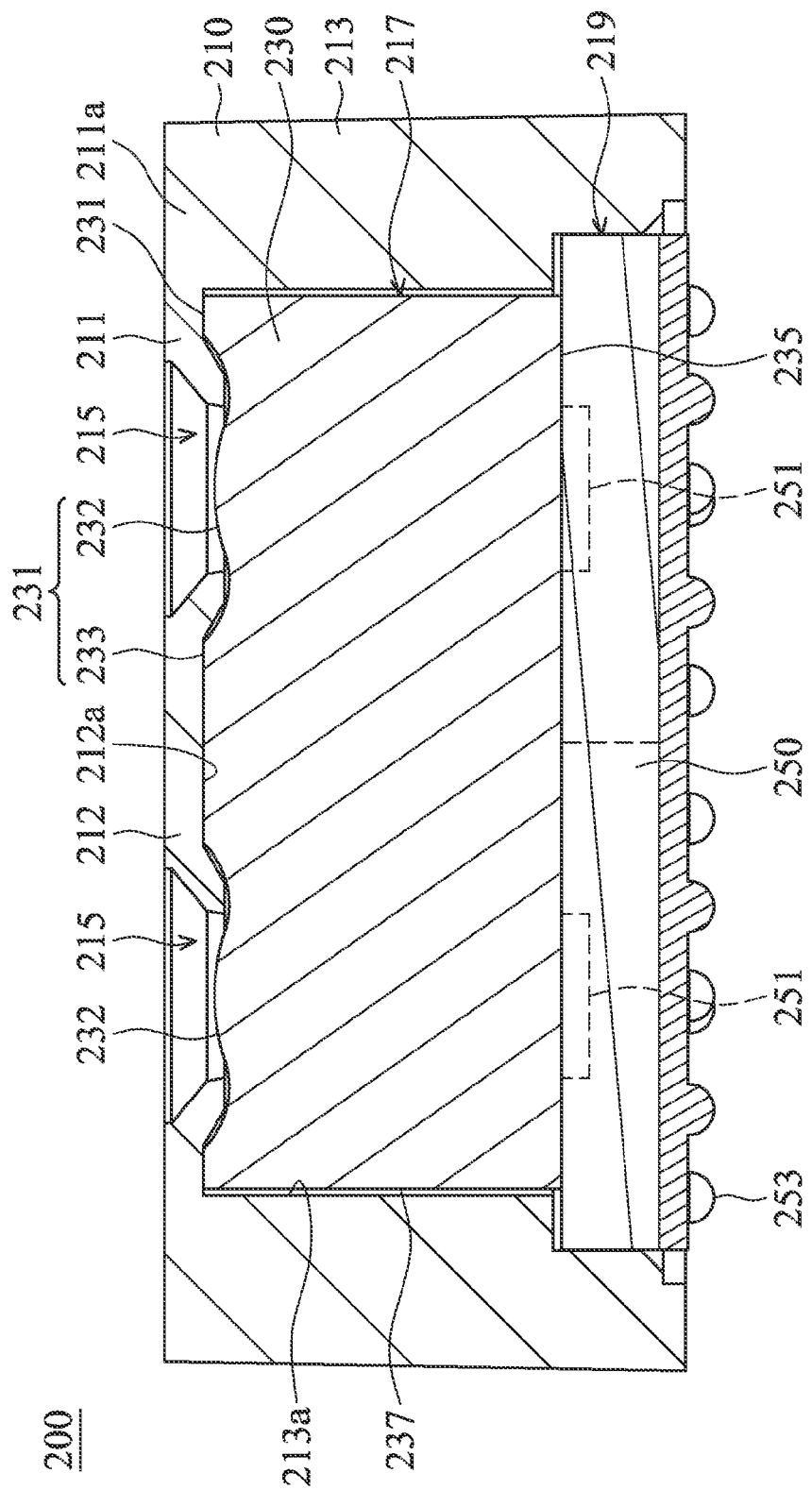
FIG. 3 shows a cross-sectional view taken along line A-A of FIG. 2 after the image capture module is assembled.

Referring to FIG. 3, the structural features of the holder 210, the lens unit 230 and the image sensor unit 250 are described hereinafter in detail. The holder 210 includes a first member 211 and a second member 213 connected to the first member 211. Specifically, the first and second members 211 and 213 are formed by an injection-molding process, wherein the second member 213 integrally extends from a peripheral edge 211a of the first member 211 to define a first chamber 217 and a second chamber 219. As shown in FIG. 3, the first and second chambers 217 and 219 are communicated with one the other, wherein the first chamber 217 is cooperatively defined by the first and second members 211 and 213, and the second chamber 219 is disposed in a position away from the first member 211 at a distance relative to the first chamber 217 and exposed to an outside. Four through holes 215 that are arranged in a 2 by 2 matrix are disposed on the first member 211, and a plurality of light blocking portions 212 are disposed between each two of the adjacent through holes 215.

The lens unit 230 is disposed in the first chamber 217 of the holder 210 and has a front surface 231 and a rear surface 235 opposite to the front surface 231. The front surface 231 of the lens unit 230 includes four light gathering regions 232 and a plurality of non-light gathering regions 233. The four light gathering regions 232 respectively align to each of the four through holes 215, and the plurality of non-light gathering regions 233 continuously extend between each two of the adjacent light gathering regions 232 and respectively align with the light blocking portions 212. In order to decrease a thickness of the image capture module 200, a surface of the first member 211 that faces the lens unit 230 has a profile compatible to that of the non-light gathering regions 233 of the front surface 231. For example, in the embodiment, surfaces 212a of the light blocking portion 212 that face to the non-light gathering regions 233 of the lens unit 230 and the non-light gathering regions 233 are both flat surfaces, such that the light blocking portion 212 is directly in contact with the non-light gathering regions 233.

Figure 4:
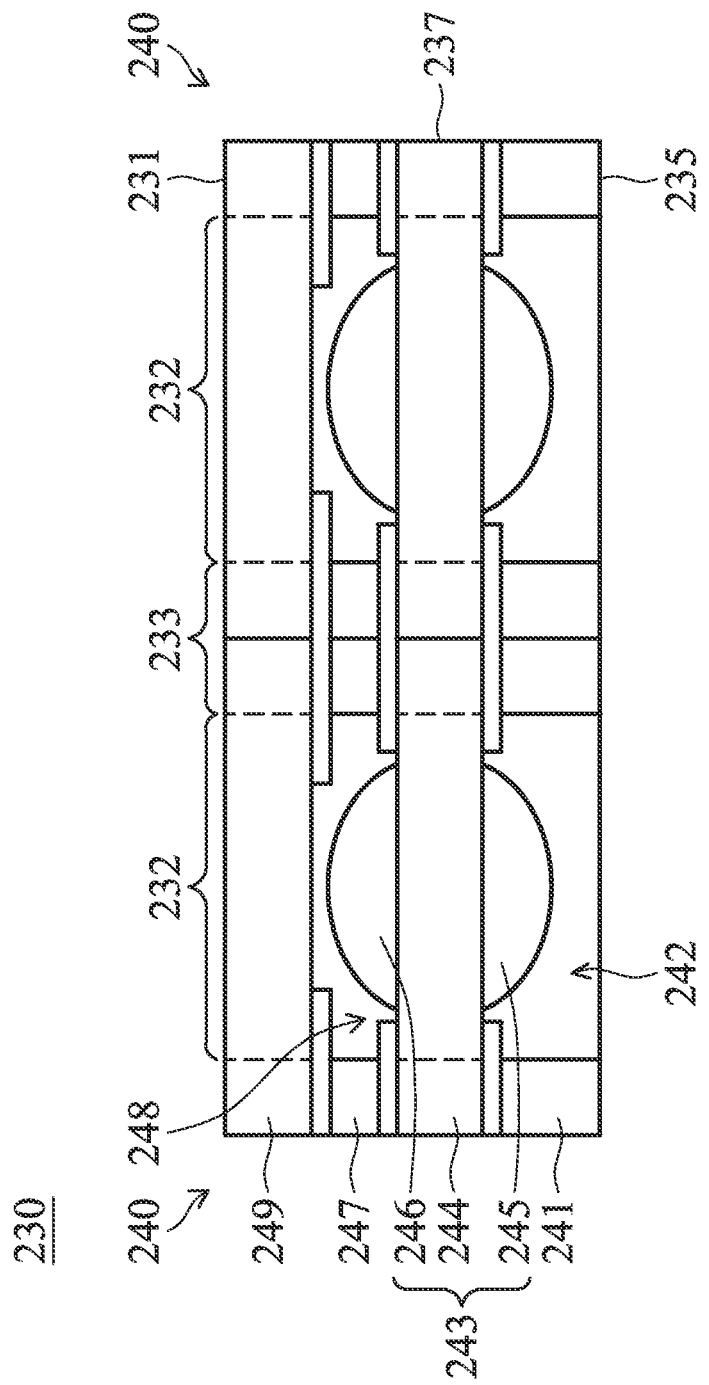
FIG. 4 shows a cross-sectional view of a lens unit of the image capture shown in FIGS. 2-3.
Figure 5:
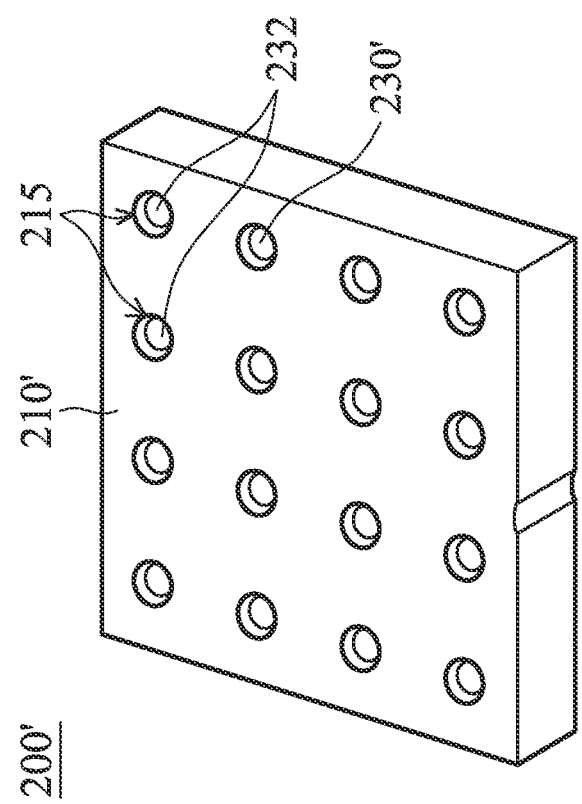
FIG. 5 shows a cross-sectional view of the image capture module in accordance with a second embodiment of the disclosure.

The lens unit 230 may have various configurations depending on requirements. For example, referring to FIG. 4, in one embodiment, the lens unit 230 may include four lenses 240 (only two lenses are shown in FIG. 4) arranged side by side, wherein each of the four lenses 240 has the same focal distance, and the optical axes thereof are spaced apart from each other by a predetermined distance. Each of the lenses 240 includes a first light blocking spacer 241, a lens layer 243, a second light blocking spacer 247 and a transparent cover plate 249. The first light blocking spacer 241 has a first through hole 242. The light gathering region 232 of the front surface 231 is disposed relative to the first through hole 242, and the non-light gathering region 233 of the front surface 231 is disposed relative to the first light blocking spacers 241.

The lens layer 243 is disposed on the first light blocking spacer 241 and covers the first through hole 242. In the embodiment, the lens layer 243 includes a transparent substrate 244, a first lens 245 and a second lens 246. The first lens 245 and the second lens 246 are respectively disposed on two opposite surfaces of the transparent substrate 244 and align with the light gathering region 232 of the front surface 231. The first lens 245 and the second lens 246 are convex lenses, but it should not be limited thereto. In other embodiments, at least one of the first lens 245 and the second lens 246 is a concave lens. The second light blocking spacer 247 is disposed on the lens layer 243. The second light blocking spacer 247 has a second through hole 248. The second through hole 248 exposes a portion of the lens layer 230 in the light gathering region 232. The transparent cover plate 249 is disposed on the second light blocking spacer 247 and covers the second through hole 248.

Referring to FIG. 3, the image sensor unit 250, for example, a complementary metal oxide semiconductor (CMOS) sensor, is disposed in the second chamber 219 of the holder 210. The image sensor unit 250 includes four image sensor chips 251 (only two image sensor chips 251 are shown in FIG. 3) corresponding to the respective of each of the lenses 240 (FIG. 4), and the image sensor chips 251 are integrally formed. That is the four image sensor chips 251, respectively receiving light from different lenses 240 (FIG. 4), are integrally formed on a single image sensor wafer. A bottom surface of the image sensor unit 250 is provided with a connection member 253 so as to be connected to a terminal of a main board on which the image capture module 200 is mounted.

While assembling the image capture module 200, the lens unit 230 may be mounted in the first chamber 217 of the holder 210 in a sliding manner, wherein a side wall 237 of the lens unit 230 that is connected between the front surface 231 and the rear surface 233 is in contact with an inner wall 213a of the first chamber 217. Next, the image sensor unit 250 is disposed in the second chamber 219. The lens unit 230 and the image sensor unit 250 may be fixed in the holder 210 by suitable means, for example, by dispensing UV glue between the lens unit 230 and holder 210 or between the image sensor unit 250 and the holder 210, and then curing the UV glue by exposure to form a compact image capture module 200 with multiple lenses.

Through the arrangement where the image capture module 200 includes multiple lenses and image sensor chips, a high quality image can be produced by synthesized multiple viewpoints which are individually captured by different lenses and image sensor chips, even though the image sensor chips each have a low image resolution, for example, of 200 pixels. Therefore, the cost of the image capture module 200 may be reduced.

Additionally, since the lens unit 230 of the image capture module 200 is held by the holder 210, the structural strength of the image capture module 200 is significantly enhanced. Moreover, the holder 210 of the invention may block flare from entering into the lens unit 230 whereby the imaging quality of the image capture module 200 is enhanced.

It will be appreciated that the number of lenses of lens units may be altered without departing from the spirit and scope of the invention. For example, as shown in FIG. 4, an image capture module 200' according to a second embodiment of the disclosure includes a holder 210' and a lens unit 230'. Sixteen through holes 215 that are arranged in a 4 by 4 matrix are disposed on a holder 210', and a lens unit 230' with corresponding number light gathering regions 232 are disposed in the holder 210', arranged such that an image quality of the image capture module 200' may be further improved.

Figure 6:
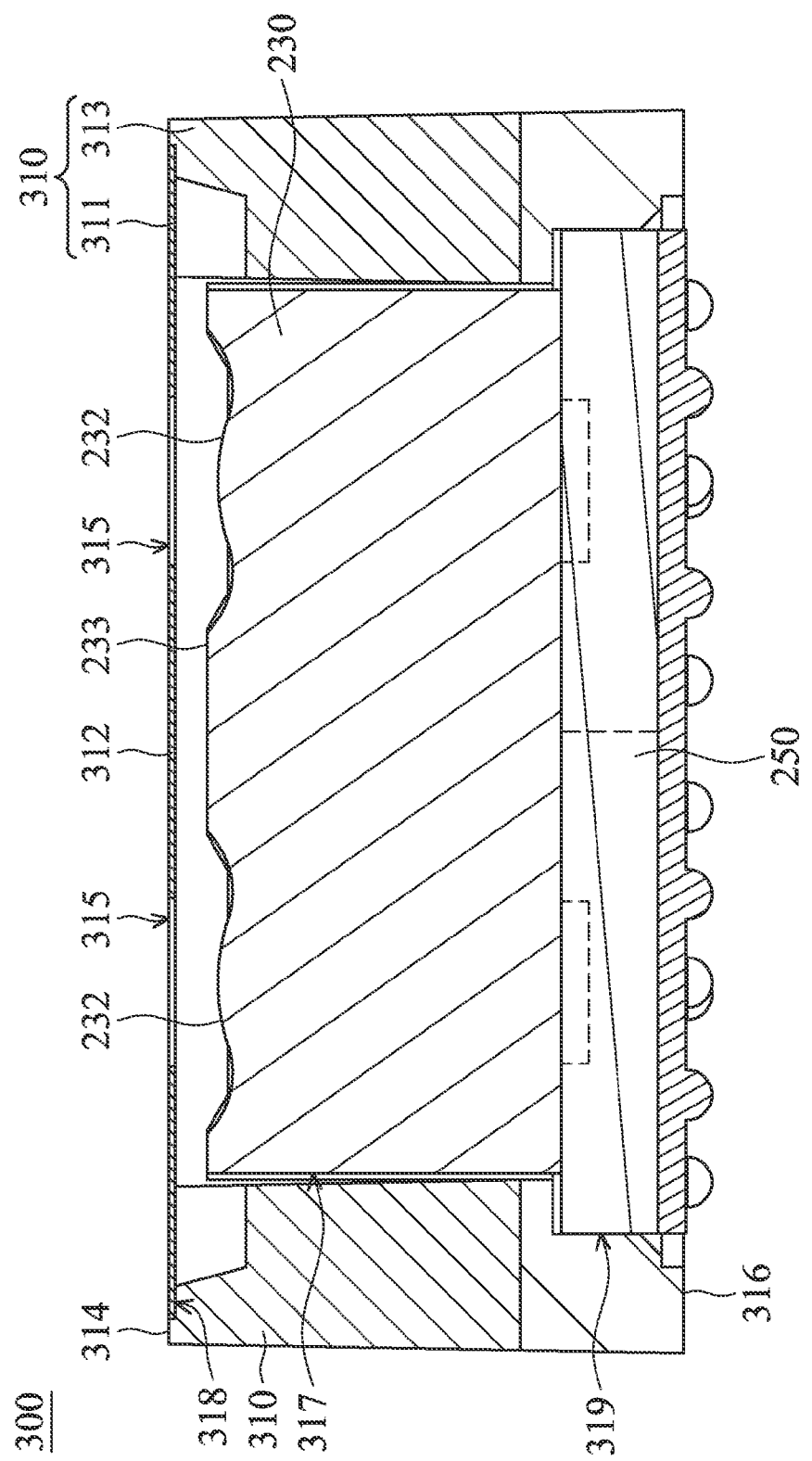
FIG. 6 shows a schematic view of an image capture module in accordance with a third embodiment of the disclosure.

Referring to FIG. 6, a cross-sectional view of an image capture module 300 in accordance with a third embodiment is shown in FIG. 6, in which elements similar with that of the image capture module 300 shown in FIGS. 2-3 are provided with the same reference numbers, thus, the features thereof are not reiterated in the interest of brevity. The image capture module 300 includes a holder 310, a lens unit 230 and an image sensor unit 250.

The holder 310 includes a first member 311 and a second member 313. The first member 311 is a non-transparent thin film with four through holes 315 arranged in a 2 by 2 matrix, wherein the first member 311 includes a plurality of light blocking portions 312 disposed between the two adjacent through holes 315. The second member 313 has a first surface 314 and a second surface 316 opposite to the first surface 314. A first and a second chamber 317 and 319 are defined by the second member 313, wherein the first chamber 317 is exposed to the first surface 314, and the second chamber 319 is exposed to the second surface 316. Additionally, a recess 318 is circumferentially disposed on the first surface 314 and connected to the first chamber 317. A peripheral portion of the first member 311 is fixed in the recess 318 by suitable means so as to cover the first chamber 317.

The lens unit 230 is disposed in the first chamber 317, and the image sensor unit 250 is disposed in the second chamber 319, wherein the light gathering regions 232 respectively align with each of the through holes 315, and the gathering regions 233 align with the light blocking portions 312. In this case, since the first member 311 is a thin film, the thickness of the image capture module 300 can be further reduced.

Figure 7:
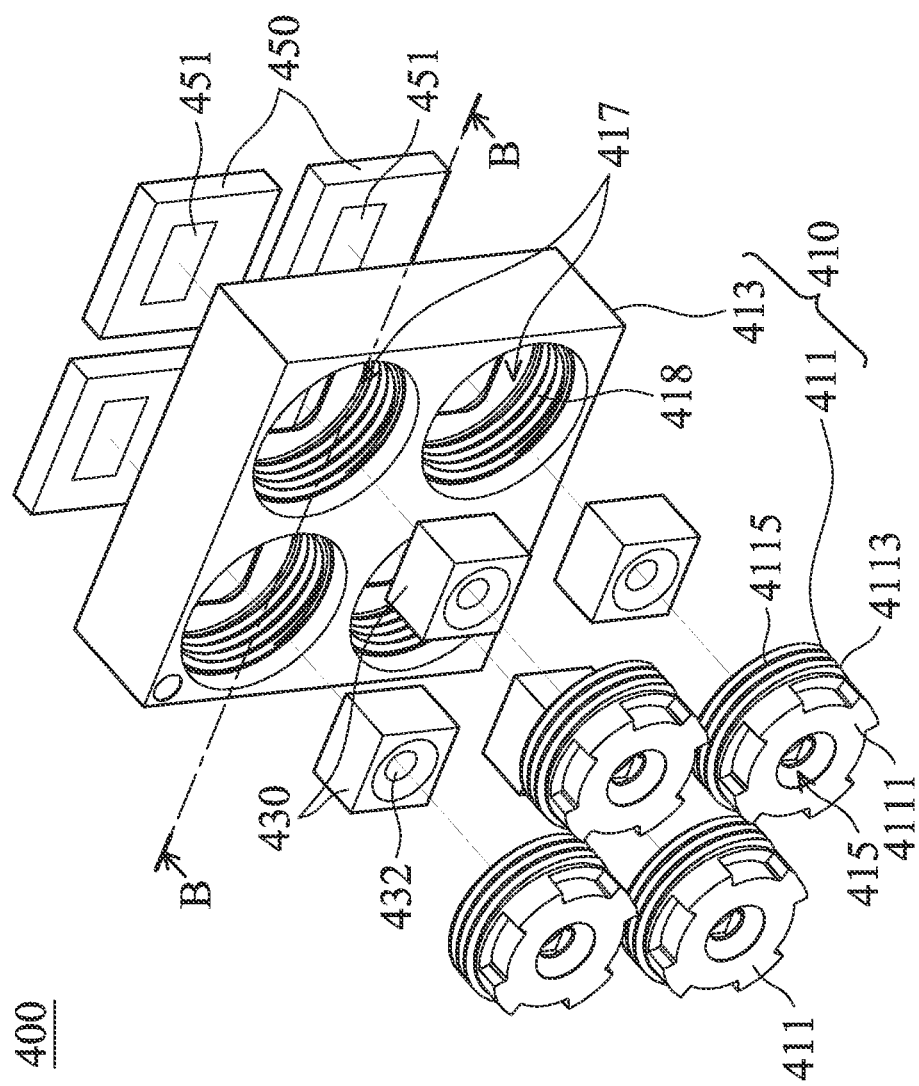
FIG. 7 shows an explosive view of an image capture module in accordance with a fourth embodiment of the disclosure.
Figure 8:
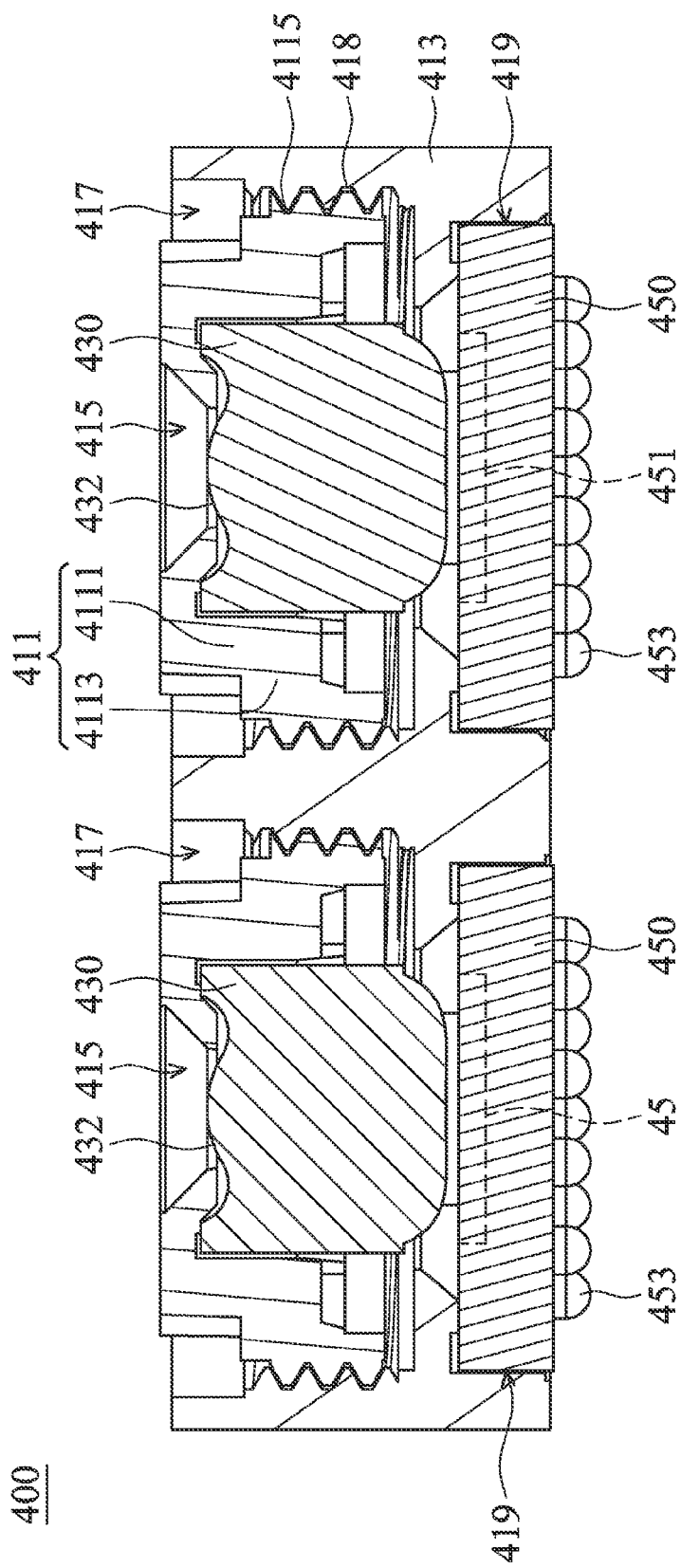
FIG. 8 shows a cross-sectional view taken along line B-B of FIG. 7.

Referring to FIGS. 7-8, an explosive view of an image capture module 400 in accordance with a fourth embodiment is shown in FIGS. 7-8. The image capture module 400 includes a holder 410, four lens units 430 and four image sensor units 450.

The holder 410 includes four first members 411 and a second member 413. Each of the four first members 411 includes a top wall 4111 and a peripheral wall 4113 peripherally protruding from the top wall 4111 to hold one of the four lens units 430, wherein a through hole 415 is disposed on the top wall 4111, and the peripheral wall 4113 includes an outer screw thread 4115.

Four first chambers 417 and four second chambers 419 are defined by the second member 413, wherein the four first chambers 417 are arranged in a 2 by 2 matrix, and each of the four first chambers 417 is communicated with one of the four second chambers 419. In the embodiment, the second member 413 includes four inner screw threads 418 which are respectively disposed in each of the four first chambers 417 and corresponds to the outer screw thread 4115 of each of the four first members 411.

Figure 9:
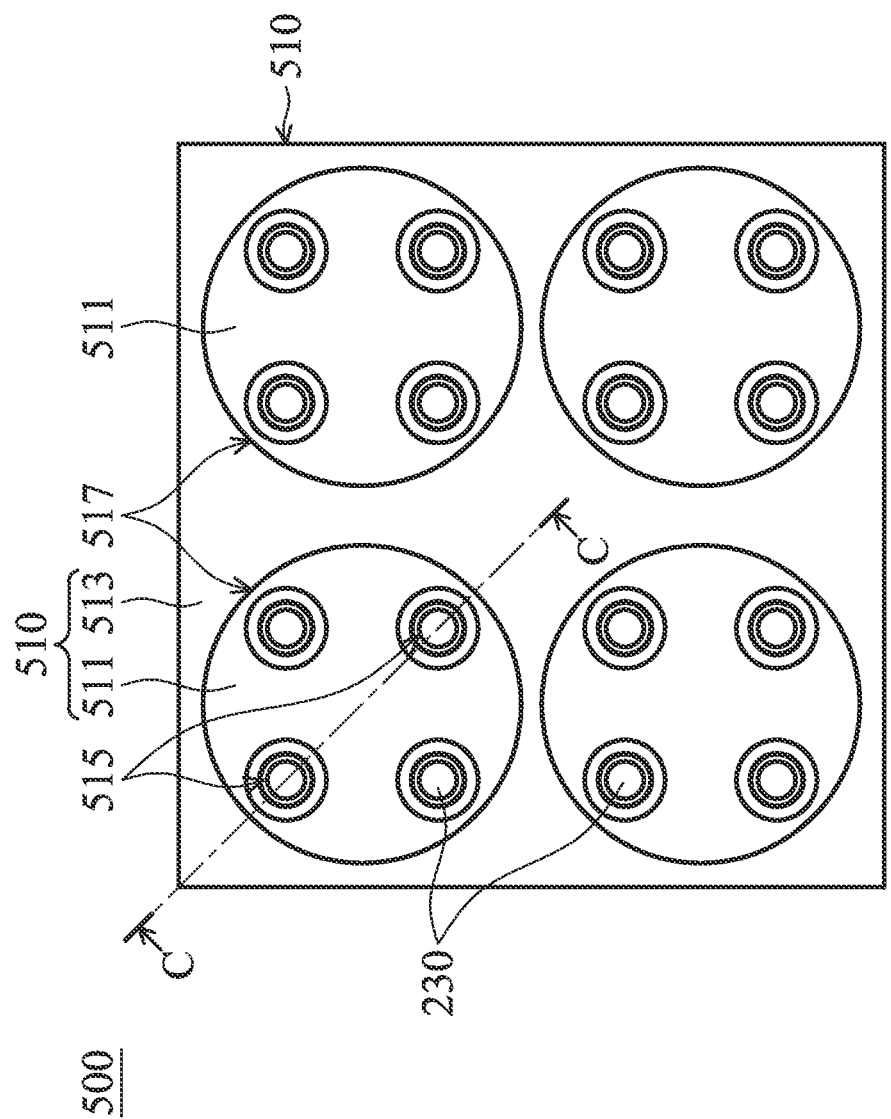
FIG. 9 shows a top view of an image capture module in accordance with a fifth embodiment of the disclosure.
Figure 10:
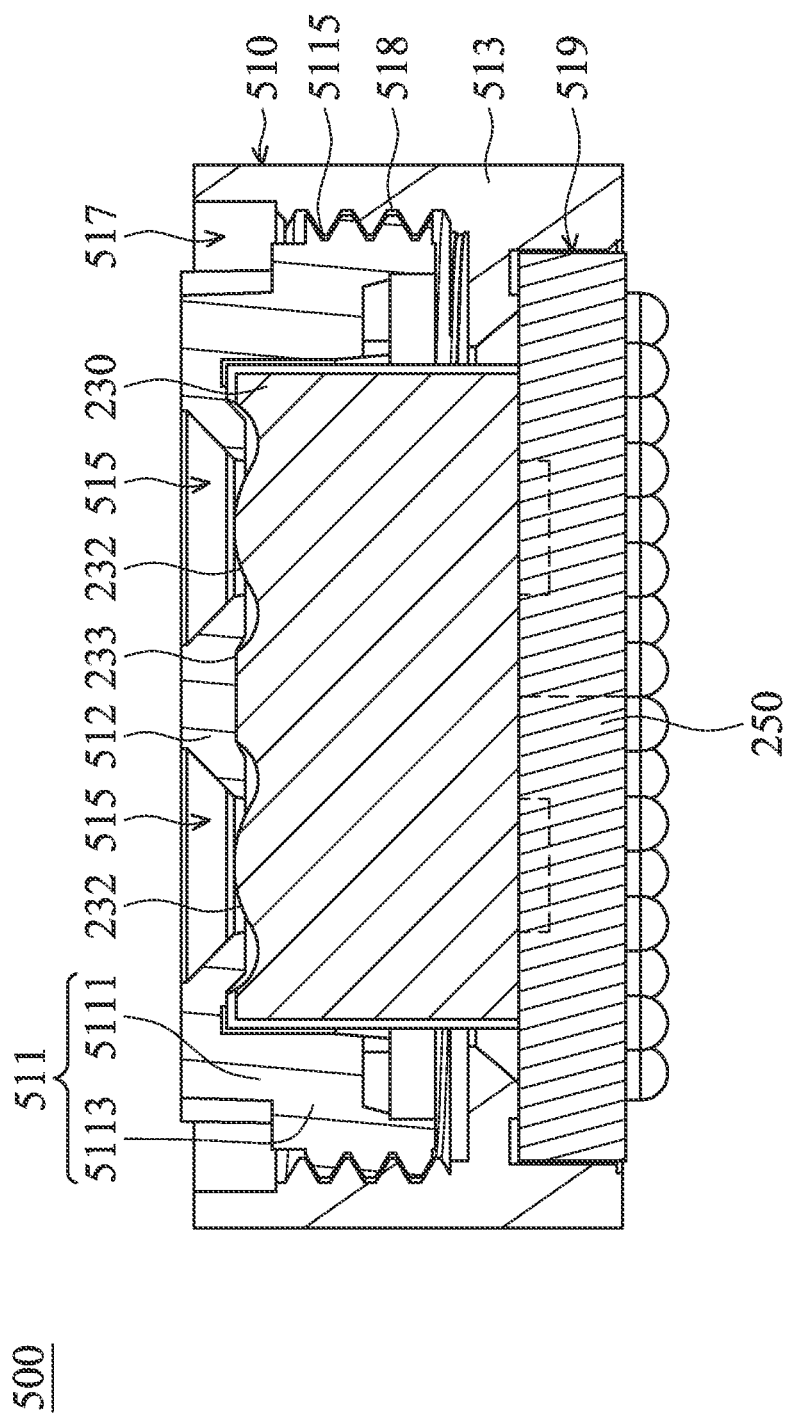
FIG. 10 shows a cross-sectional view taken along line C-C of FIG. 9.

While assembling, each of the four lens units 430 is mounted into a space defined by the top wall 4111 and the peripheral wall 4113 of each of the four first members 411, wherein a light gathering region 432 of each of the lens units 430 is aligned with the through hole 415 of the corresponding first member 411. Next, each of the four first members 411 is disposed in the first chamber 417 of the holder 410 and connected with the second member 413 via engagement between the inner screw thread 418 and the outer screw thread 4115. Each of the four image sensor units 450, for example, a complementary metal oxide semiconductor (CMOS) sensor, is disposed in the second chamber 419 of the holder 410 and aligns with the rear surface of the corresponding lens unit 430. Each of the four image sensor units 450 includes one image sensor 451 to receive light passing through the lens units 430 and is provided with a connection member 453 so as to be connected to a terminal of a main board on which the image capture module 400 is mounted Referring to FIGS. 9-10, an explosive view of an image capture module 500 in accordance with a third embodiment is shown in FIGS. 9-10. The image capture module 500 includes a holder 510, four lens units 230 and four image sensor units 250.

The holder 510 includes four first members 511 and a second member 513. Each of the four first members 511 includes a top wall 5111 and a peripheral wall 5113 peripherally protruding from the top wall 5111 to hold one of the four lens units 230, wherein four through holes 515 are disposed on the top wall 5111, and the peripheral wall 5113 includes an outer screw thread 5115.

Four first chambers 517 and four second chambers 519 (only one second chamber 519 is shown in FIG. 10) are defined by the second member 513, wherein the four first chambers 517 are arranged in a 2 by 2 matrix, and each of the four first chambers 517 is communicated with one of the four second chambers 519. In the embodiment, the second member 513 includes four inner screw threads 518 respectively disposed in each of the four first chambers 517 and corresponding to the outer screw thread 5115 of the first members 511.

While assembling, each of the four lens units 230 is mounted into a space defined by the top wall 5111 and the peripheral wall 5113 of each of the first members 511. Specifically, the four light gathering regions 232 of each of the lens units 230 align with the through holes 515 of the corresponding first member 511, and the non-light gathering regions 233 align with the light blocking portion 512 of the corresponding first member 511. Next, each of the four first members 511 is disposed in the first chamber 517 of the holder 510 and connected with the second member 513 via engagement between the inner screw thread 518 and the outer screw thread 5115. Each of the four image sensor units 250 aligning with the rear surface of the corresponding lens unit 230 is disposed in the second chamber 519 of the holder 510.

In the embodiments shown in FIGS. 7-10, since the first members in which the lens units are disposed can be detached from the second members independently, the lens units that fail to satisfy requirements can be removed and the other functional lens units can be remained, so that an increase of manufacturing yield of the image capture module may be achieved.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image capture module, comprising:
   a holder, comprising:
   a first member, wherein a plurality of through holes are disposed on the first member, and the first member comprises at least one light blocking portion disposed between two of the through holes adjacent to one another; and
   a second member, connected to the first member, wherein at least one first chamber is defined by the second member, wherein the second member integrally extends from a peripheral edge of the first member to define the first chamber;
   a lens unit, disposed in the at least one first chamber of the holder, wherein the lens unit has a front surface and a rear surface opposite to the front surface, and the front surface comprises a plurality of light gathering regions respectively aligning with each of the plurality of through holes, and at least one non-light gathering region disposed between two adjacent light gathering regions and aligning with the light blocking portion; and
   an image sensor unit, wherein at least one second chamber that communicates with the first chamber is defined by the second member, and the image sensor unit aligns with the rear surface of the lens unit and is disposed in the second chamber.

2. The image capture module as claimed in claim 1, wherein the at least one non-light gathering region extends between two adjacent light gathering regions, and the first member covers the non-light gathering region of the lens unit.

3. The image capture module as claimed in claim 1, wherein a surface of the light blocking portion that aligns with the non-light gathering region of the lens unit is a flat surface.

4. The image capture module as claimed in claim 1, wherein the plurality of through holes are disposed on the first member in a matrix.

5. The image capture module as claimed in claim 1, comprising a plurality of lens units, wherein a plurality of first chambers are defined by the second member, and the holder comprises a plurality of first members respectively disposed in each of the plurality of first chambers and holds the lens units.

* * * * *